(12) United States Patent
Duarte et al.

(10) Patent No.: US 10,094,531 B2
(45) Date of Patent: *Oct. 9, 2018

(54) LED SUBSTRATE WITH ELECTRICAL CONNECTION BY BRIDGING

(71) Applicant: Valeo Vision, Bobigny (FR)

(72) Inventors: Marc Duarte, Villemomble (FR); Zdravko Zojceski, Courbevoie (FR)

(73) Assignee: VALEO VISION, Bobigny (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/102,964

(22) PCT Filed: Dec. 19, 2014

(86) PCT No.: PCT/EP2014/078892
§ 371 (c)(1),
(2) Date: Jun. 9, 2016

(87) PCT Pub. No.: WO2015/092034
PCT Pub. Date: Jun. 25, 2015

(65) Prior Publication Data
US 2016/0298818 A1    Oct. 13, 2016

(30) Foreign Application Priority Data

Dec. 20, 2013    (FR) ...................................... 13 63260

(51) Int. Cl.
*F21S 8/10*    (2006.01)
*H05K 1/02*    (2006.01)
(Continued)

(52) U.S. Cl.
CPC ............ *F21S 48/328* (2013.01); *F21S 41/141* (2018.01); *F21S 41/147* (2018.01); *F21S 41/192* (2018.01);
(Continued)

(58) Field of Classification Search
CPC .. F21S 48/328; F21S 48/1104; F21S 48/1109; F21S 48/115; F21S 48/1159;
(Continued)

(56) References Cited

U.S. PATENT DOCUMENTS 6,161,910 A    12/2000   Reisenauer et al.
6,821,143 B2   11/2004   Gasquet et al.
(Continued)

FOREIGN PATENT DOCUMENTS

FR    2840151 A1    11/2003
FR    2853200 A1    10/2004

*Primary Examiner* — Alexander Garlen
(74) *Attorney, Agent, or Firm* — Oblon, McClelland, Maier & Neustadt, L.L.P.

(57) ABSTRACT

A support for one or more light sources for a lighting and/or light-signaling module for an automotive vehicle, comprising a substrate made of heat-conducting material, preferably made of a metal material, at least one light source of light-emitting diode type with one face for mounting on the substrate, in thermal contact with the latter and a circuit for controlling the electrical power supply of the one or more light sources. The circuit for controlling the power supply is electrically connected to the one or more light sources by means of metal wires that are soldered to the surface 044-using the technique commonly referred to as "wire/ribbon bonding". A method for assembling such a support.

16 Claims, 2 Drawing Sheets

(51) Int. Cl.

| | | |
|---|---|---|
| *H05K 1/03* | (2006.01) | |
| *H05K 1/18* | (2006.01) | |
| *H05K 3/34* | (2006.01) | |
| *H05K 3/00* | (2006.01) | |
| *F21V 29/76* | (2015.01) | |
| *F21S 41/19* | (2018.01) | |
| *F21S 41/141* | (2018.01) | |
| *F21S 41/147* | (2018.01) | |
| *F21S 43/14* | (2018.01) | |
| *F21S 45/47* | (2018.01) | |
| *F21Y 107/90* | (2016.01) | |

(52) U.S. Cl.
CPC ............... *F21S 43/14* (2018.01); *F21S 45/47* (2018.01); *F21V 29/763* (2015.01); *H05K 1/0203* (2013.01); *H05K 1/0366* (2013.01); *H05K 1/181* (2013.01); *H05K 3/0061* (2013.01); *H05K 3/341* (2013.01); *F21Y 2107/90* (2016.08); *H01L 2924/0002* (2013.01); *H05K 2201/10106* (2013.01); *H05K 2201/10287* (2013.01); *H05K 2203/049* (2013.01)

(58) Field of Classification Search
CPC ...... F21S 48/211; F21S 48/212; F21S 48/215; F21V 29/763; H05K 1/0203; H05K 1/0366; H05K 1/181; H05K 3/0061; H05K 3/341

See application file for complete search history.

(56) References Cited

U.S. PATENT DOCUMENTS

| | | |
|---|---|---|
| 7,210,833 B2 | 5/2007 | Gasquet et al. |
| 8,177,402 B2 | 5/2012 | Ackermann et al. |
| 2004/0029436 A1 | 2/2004 | Gasquet et al. |
| 2004/0190294 A1 | 9/2004 | Gasquet et al. |
| 2006/0181878 A1* | 8/2006 | Burkholder ............ F21S 48/321 362/294 |
| 2010/0027284 A1 | 2/2010 | Ackermann et al. |
| 2011/0084612 A1 | 4/2011 | Ratcliffe et al. |
| 2011/0127912 A1* | 6/2011 | Lee ...................... F21S 48/1159 315/32 |
| 2011/0182054 A1 | 7/2011 | Lee et al. |
| 2012/0201043 A1* | 8/2012 | DiPenti ................ F21S 48/1104 362/545 |
| 2012/0217862 A1* | 8/2012 | Matsuda ................. F21K 9/232 313/46 |
| 2013/0107564 A1* | 5/2013 | Yatsuda .................. F21S 48/32 362/543 |
| 2013/0135886 A1* | 5/2013 | Tanaka ..................... B60Q 1/04 362/516 |

\* cited by examiner

LED SUBSTRATE WITH ELECTRICAL CONNECTION BY BRIDGING

CROSS-REFERENCE TO RELATED APPLICATIONS

This application is the U.S. National Phase application of PCT Application No. PCT/EP2014/078892 filed Dec. 19, 2014, which claims priority to the French application 1363260 filed on Dec. 20, 2013, which applications are incorporated herein by reference and made a part hereof.

BACKGROUND OF THE INVENTION

1. Field of the Invention

The invention relates to the field of lighting and/or light signaling, especially for automotive vehicles. More specifically, the invention relates to the field of mounting and electrically connecting light sources of the light-emitting diode (LED) type. The invention relates to a support for one or more light sources, to a module comprising such a support and to a method for assembling the support.

2. Description of the Related Art

The use of light sources of the light-emitting diode type in lighting and/or light-signaling systems is increasingly widespread. In the field of automotive lighting and light signaling, diodes referred to as high-power diodes are used. The latter are often generally planar and of the surface-mount type. Surface-mounting components consists in brazing the components of a board to its surface (SMD for "surface-mounted device") rather than passing pins therethrough. As light-emitting diodes are semiconductors, they are affected by temperature: the more they heat up, the more their direct junction voltage decreases, and their luminous efficiency deteriorates. For reasons of reliability and luminous performance, measures with the aim of ensuring heat dissipation must be implemented, especially for high-power models.

The published patent document FR 2 840 151 A1 which is equivalent to U.S. Pat. No. 6,821,143 and U.S. Patent Publication No. 2004/0029436, discloses a high-power light-emitting diode support for a lighting or light-signaling system for an automotive vehicle. The diode is bonded to a metal substrate forming a radiator. This substrate is fixed to an electrically insulating board. It comprises two indentations that each extend, in opposite directions, from an edge of the substrate up to the edge of the diode. A conductive tongue is positioned in each of the two indentations in order to ensure an electrical connection between the diode and the printed circuit on the board, the metal substrate ensuring the cooling of the diode. Each of the tongues is connected by solder to one of the electrodes of the diode. The configuration of this teaching is noteworthy inasmuch as it allows the diode to be cooled while being supported by means of a conventional insulating board. The cooling capacity is nevertheless limited, essentially because of the limited size of the metal substrate. Moreover, precision of positioning is also limited, taking into account the addition of the positioning tolerances of the diode with respect to the heat sink substrate, of the latter with respect to the board and then of the latter with respect to the reflector or the frame of the lighting or light-signaling module.

The published patent document FR 2 853 200 A1 which is equivalent to U.S. Pat. No. 7,210,833 and U.S. Patent Publication No. 2004/0190294, discloses, similarly to the preceding document, a high-power light-emitting diode support for a lighting or light-signaling system for an automotive vehicle. Similarly to the preceding document, the diode is fixed to a metal substrate that is capable of dissipating the heat produced by the diode. This substrate is fixed to a board made of an electrically insulating material and comprises two opposite indentations through which extend, respectively, two electrical connection tabs or tongues. Alternatively to the method of bonding the diode to the heat sink substrate disclosed in the preceding document, the diode of this teaching comprises a base that is essentially composed of copper which is fixed to the substrate by laser spot soldering. These measures are intended to avoid the drawbacks that are inherent to the use of adhesive, namely the drying or cross-linking time, the means required for its application, the time taken for its application and the means for keeping the diode on the heat sink substrate until the adhesive ensures its fixation. Similarly to the preceding document, the cooling capacity in this construction is limited, essentially because of the limited size of the metal substrate. Still similarly to the preceding document, the precision of positioning of the diode is limited.

SUMMARY OF THE INVENTION

An aim of the invention is to propose a high-power light-emitting diode support, in particular for a lighting and/or light-signaling system for an automotive vehicle, which ensures better cooling and/or better precision of positioning of the one or more diodes.

A subject of the invention is a support for one or more light sources for a lighting and/or light-signaling module for an automotive vehicle, comprising: a substrate made of heat-conducting material, preferably made of a metal material; at least one light source of light-emitting diode type with one face for mounting on the substrate, in thermal contact with the latter; a circuit for controlling the electrical power supply of the one or more light sources; noteworthy in that the circuit for controlling the power supply is electrically connected to the one or more light sources by means of metal wires that are soldered to the surface.

In particular, the light-emitting diodes that are implemented in the context of the present invention are high-power diodes that are mounted on a base made of a ceramic material. They are without a metal plate on the side of the mounting face of the base. These light-emitting diodes are therefore composed of a light-emitting semiconductor component placed on the base, using means that allow the semiconductor component to be supplied with electrical power such as gold microbumps, a layer of gold solder or a gold wire.

These light-emitting diodes on a ceramic base allow better management of thermal stresses and, above all, increased precision of positioning facing an optical device that is intended to transmit the light emitted by these diodes in comparison with other light-emitting diode package types, which are bulkier and whose bases have a more extensive surface, usually comprising a metal plate and generally made of copper or aluminum, on the side of the face in contact with the support.

In the context of the present invention, the metal wires may be formed by a wire with a cylindrical cross section, a metal braid or a tongue. These metal wires are bare, i.e. without a sheath of insulating material.

According to one advantageous embodiment of the invention, the metal wires aerially extend, preferably with looping profiles, away from the respective outer surfaces of the circuit for controlling the power supply and of the one or more light sources.

In special cases, according to requirements to protect from vibrations or corrosion, the metal wires may be covered by a drop of an epoxy or silicone material according to the coating technique known by the term "glob top".

The outer faces of the circuit for controlling the power supply and of the one or more light sources to which it is connected are essentially at the same height or at least vary in height by less than 10 mm, preferably 5 mm, more preferably 3 mm.

According to one advantageous embodiment of the invention, the circuit for controlling the power supply is borne by the substrate and comprises an edge that is facing the, or at least one of the, light source(s).

According to one advantageous embodiment of the invention, the circuit for controlling the power supply is printed on or in a board made of an electrically insulating material, which board is positioned on the substrate.

According to one advantageous embodiment of the invention, the board is generally planar, preferably made of a thermosetting resin reinforced with solid fibers. Alternatively, the board is an insulated metal substrate (IMS).

The electrical circuit may be printed on the board.

According to one advantageous embodiment of the invention, the board is made of a molded plastic material hugging the form of the substrate. The electrical circuit may be embedded in the board. A connector may be formed in one piece with the board.

According to one advantageous embodiment of the invention, the substrate comprises two opposite faces, each of the two faces bearing one of the light sources, the substrate comprising an orifice that connects the two faces and is positioned opposite the board so as to allow the electrical connection with the one or more light sources on the face of the substrate opposite that on which the board is positioned. The substrate may comprise a plurality of such orifices.

According to one advantageous embodiment of the invention, at least one of the metal wires, connected to the face of the board that is in contact with the substrate and to the, or one of the, diode(s) on the face of the substrate opposite that on which the board is positioned, passes through the orifice. Alternatively, the metal wire may be replaced by a metal braid or a tongue making the electrical connection.

According to one advantageous embodiment of the invention, the board comprises a portion that extends through the orifice, the portion comprising at least one electrical contact, one of the metal wires extending from the contact to the, or one of the, light source(s) on the face of the substrate opposite that on which the board is positioned. The portion of the board that extends through the orifice may be made in one piece of the same material with the rest of the board, this then being able to be achieved by molding plastic material. The portion of the board that extends through the orifice may also be added on, in particular by bonding to the rest of the board.

According to one advantageous embodiment of the invention, the substrate comprises cooling fins.

According to one advantageous embodiment of the invention, the substrate comprises a first portion that forms a wall bearing the one or more light sources and a second portion comprising the cooling fins.

According to one advantageous embodiment of the invention, the second portion is positioned essentially in line with the first portion.

According to one advantageous embodiment of the invention, the first and second portions of the substrate are made in one piece of the same material.

According to one advantageous embodiment of the invention, the one or more light sources are bonded to the substrate. The adhesive may be loaded with silver (Ag) or particles of ceramic in order to confer heat conduction properties thereon.

According to one alternative embodiment of the invention, the one or more light sources are soldered to the substrate, for example by means of a eutectic solder or using sintering methods. In this case, in order to make soldering possible, metalization of the mounting face of the ceramic base is carried out beforehand by deposition of a thin layer of metal, e.g. aluminum, for example by plasma-enhanced chemical vapor deposition.

Another subject of the invention is a lighting module for an automotive vehicle, comprising: a support for one or more light sources; at least one optical device that is capable of transmitting the light rays that are emitted by the, or at least one of the, light source(s) as a lighting beam, noteworthy in that the support is in accordance with the invention.

According to the invention, the optical device is taken alone or in combination from among: a reflector, a projection lens, a light guide.

According to one advantageous embodiment of the invention, the module comprises a first optical device that is positioned facing one of the two faces of the substrate, the face bearing at least one of the light sources and a second optical device that is positioned facing the other of two faces, the other face bearing at least one of the light sources.

According to one advantageous embodiment of the invention, the substrate comprises cooling fins that are positioned behind the one or more optical devices, such as a reflector, with respect to the main direction of the illuminating beam.

Another subject of the invention may be a projector or a light-signaling device comprising a module according to the invention and/or a support according to the invention.

Another subject of the invention is a method for assembling a support according to the invention, noteworthy for the following steps: (a) fixing the one or more light sources, by bonding or soldering, to the substrate and placing the circuit for controlling the power supply on the substrate; and (b) placing the electrical wires between the circuit for controlling the power supply and the one or more light sources by bridging and soldering using ultrasound.

In step (a), the operations of positioning and fixing the one or more light sources and the operations of placing the circuit for controlling the power supply may be carried out concomitantly or one after the other, in either order.

The measures of the invention are noteworthy in that they allow the light sources to be positioned with high precision directly on the substrate that serves as a frame and reference part for the optical device with which it is associated. The cooling of the light sources is also optimized. The one or more circuits for controlling the electrical power supply may be positioned and fixed with less precision than the light sources, in particular in proportion to the size of their lands for contact with the metal wires. The connection technique via bridging with metal wires, braids or tongues that are preferably soldered using ultrasound, but also using laser or electric resistance soldering, makes it possible to subsequently make electrical connections in a manner that is simple, reliable, economical and compatible with the connection of the light sources via fixation with adhesive or solder.

These and other objects and advantages of the invention will be apparent from the following description, the accompanying drawings and the appended claims.

BRIEF DESCRIPTION OF THE ACCOMPANYING DRAWINGS

Other features and advantages of the present invention will be better understood with the aid of the description and the drawings, in which.

DETAILED DESCRIPTION OF THE PREFERRED EMBODIMENTS

Figure 1:
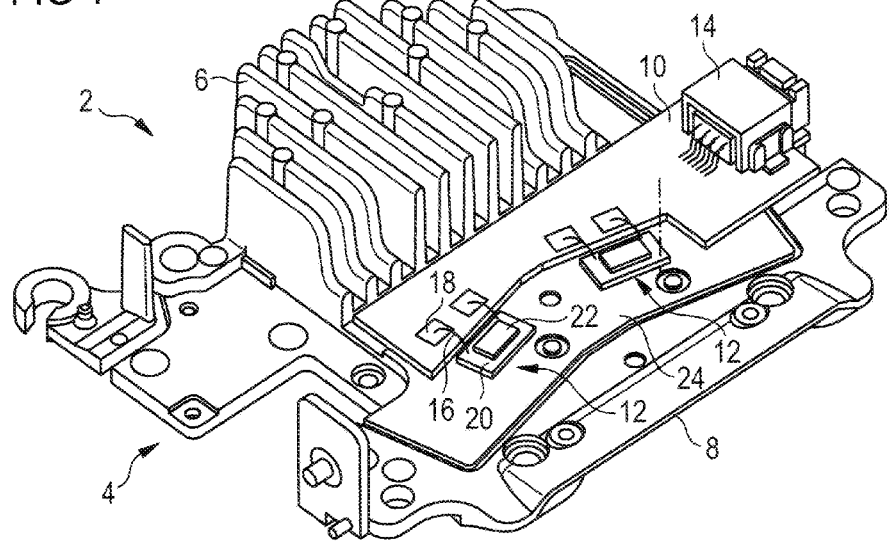
FIG. 1 is a perspective view of a light-emitting diode support according to a first embodiment of the invention, the view showing the top face of the support.
Figure 2:
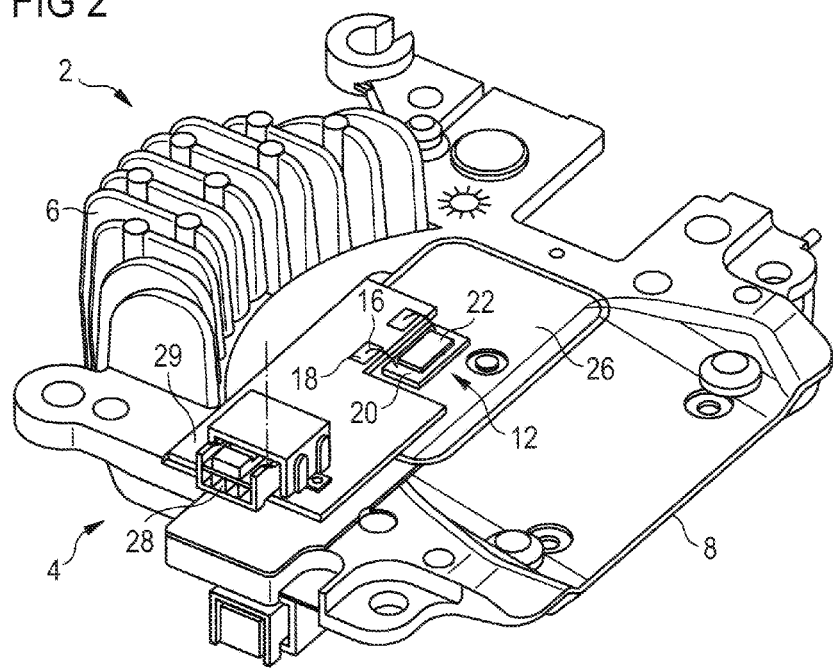
FIG. 2 is a perspective view of the support of FIG. 1, the view however showing the bottom face of the support.

FIGS. 1 and 2 illustrate a first embodiment of the invention. FIG. 1 is a perspective view of the top face 24 of a support 2 for light sources of the light-emitting diode type. The support 2 essentially comprises a substrate 4 bearing light-emitting diodes 12. More specifically, the substrate 4 made of a heat-conducting material, such as e.g. aluminum, comprises a first, generally thin and flat, first portion 8 and a second portion 6 forming cooling fins. The first portion 8 and second portion 6 are preferably in one piece, more preferably made in one piece of the same material. The fins or second portion 6 may extend in a direction that is generally transverse, preferably perpendicular, to the midplane of the first portion 8.

The top face 24 of the first portion 8 bears two light-emitting diodes 12. These are high-power diodes, i.e. with a power that is greater than or equal to 3 watts, and they are capable of being fixed by their base 20. The light-emitting diodes 12 comprise a base 20 made of a ceramic material and an optical portion 22 on the base 20. It will be recalled that the ceramic base 20 is without a metal plate on its face for mounting on the support 2. The base 20 of the diodes 12 is here fixed to the substrate 4 by means of a thermal adhesive, i.e. by means of an adhesive having heat transmission properties. This may be an adhesive sold under the trade names EPO-TEK®, Dow Corning® or Henkel®.

A board 10 covered by a printed electrical circuit (not shown) is also positioned on the first, essentially flat, portion 8 of the substrate 4. The profile of the board 10 is adapted to the diodes 12 so as to run alongside them for a distance that is less than 10 mm, preferably 5 mm. A connector 14 is positioned on the board 10 so as to allow it to be supplied with power via a flexible cable or a press-fit connector or similar (not shown). Contact lands 18 are provided on the board 10 facing the diodes 12, these contact lands 18 being electrically connected to the printed circuit. The diodes 12 are electrically connected to the circuit for controlling the power supply of the board 10 via metal wires 16 that form bridges between the contact lands 18 of the board 10 and the corresponding contact lands of the diodes 12. These wires 16 are soldered to the contact lands 18 and the contact lands of the diodes 12, in particular using ultrasound. This technique is commonly referred to as "wire bonding" or "bridging". It is a technique commonly used for making the electrical connections between the package and the chip of an integrated circuit. The bond is simply achieved via a wire 16 (or bridge) soldered between the two connection pads that are provided for this purpose on each of the elements. The soldering is generally carried out using ultrasound. The material of the wire 16 is aluminum, gold or copper, or a combination of these materials. The diameter of the wire 16 may be between 35 μm and 200 μm. One or more wires 16 may be used for each connection. Potentially, a metal braid or a metal tongue may be used as per the term "ribbon bonding", with a typical length of 500 μm and thickness of 25 μm. Laser or electric resistance soldering may also be envisaged. It will be specified here that in the context of the present invention, the soldering of the wires 16 is carried out without input of material, in particular without filler metal.

FIG. 2 is a view of the bottom face 26 of the support 2 of FIG. 1. Similarly to the top face 24, the bottom face 26 of the generally thin and flat first portion 8 of the substrate 4 bears a diode 12, this diode 12 possibly being similar or identical to those located on the bottom face 26 of the first portion 8 of the substrate 4. The diode 12 is also fixed via bonding by means of a thermal adhesive. A board 29 is also fixed to the top face 24 of the first portion 8 of the substrate 4, this board 29 comprising a, preferably printed, circuit (not shown) that is intended to supply electrical power to the diode 12. Contact lands 18 that are similar to those of the board 10 of the bottom face 26 are also envisaged. The electrical connection between the circuit of the board 29 and the diode 12 is also ensured by soldered wires 16 forming a bridge. The board 29 comprises a connector 28 that is intended to allow the supply of power thereto from a flexible cable (not shown).

For the top face 24 and bottom face 26, the wires 16 of the electrical connection extend in a generally curved manner away from the outer surfaces of the diodes 12 and of the board 10. This connection technique consists in putting a first end of a metal wire 16 in contact with a contact land of one of the diodes 12 and of the board 10, and then applying ultrasound thereto in order to solder it thereto. After soldering, the wire 16 may then be unwound from a tool to then be cut and applied to the second of the two contact lands 18 to be electrically connected. These wires 16 are thus rigidly fixed by their ends to the respective contact lands 18, these rigid connections ensuring that the rest of the wire 16 is held in position as may be seen in FIGS. 1 and 2. A metal braid or tongue may be used as a wire 16. Laser or electric resistance soldering may also be envisaged.

From an assembly process and method point of view, the diodes 12 are directly placed on the substrate 4 in a precise manner, avoiding any build-up of tolerances, in particular when they are on a support 2 which is itself positioned on a board 10 which is itself positioned on the substrate 4 serving as reference part. Specifically, the substrate 4 comprises means for fixing to a package (not shown) and is intended to receive optical devices such as reflectors, projection lenses or light guides interacting with the diodes 12. The precision of positioning may attain a tolerance of up to 30 μm, with a standard deviation of 5-7 μm, which is unattainable with light-emitting diode package types other than those according to the invention, which are mounted on a base 20 made of a ceramic material. The one or more boards 10 may be placed before or after placing the one or more corresponding diodes 12. The operation of placing the metal bridging wires 16 is carried out after the one or more diodes 12 and the one or more boards 10 have been placed.

The support 2 illustrated in FIGS. 1 and 2 is intended to form a bifunctional lighting module. The diodes 12 of the top face 24 ensure a first lighting function with horizontal cut-off of low beam or "passing" type. The diode 12 on the bottom face 26 forms a beam that complements that of the first function, thus forming a second function referred to as the high beam, i.e. without horizontal cut-off. An optical device such as, for example, a reflector with a parabolic profile and in the form of a half-shell is intended to be positioned on both the top face 24 and the bottom face 26 of the thin and essentially planar first portion 8 of the substrate 4. The substrate 4 thus forms the frame of the lighting module.

Figure 3:
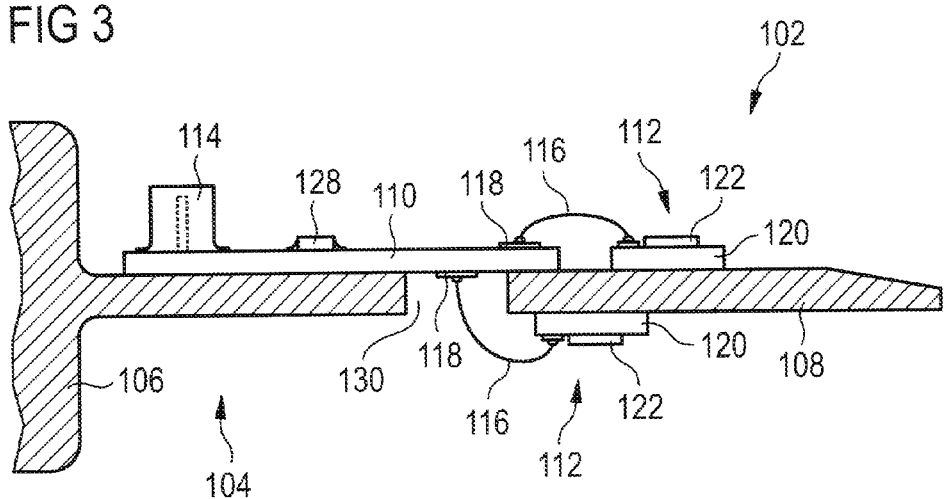
FIG. 3 is a cross-sectional view of a light-emitting diode support according to a second embodiment of the invention.

FIG. 3 illustrates a second embodiment of the invention. It is a longitudinal cross-sectional view of a diode support 102 similar to that of the first embodiment. The reference numbers of the first embodiment are used in the second embodiment for elements that are similar or identical, these numbers being increased by 100 in order to clearly distinguish between the two embodiments. Reference is furthermore made for these elements to the corresponding description of the first embodiment. Specific numbers of between 100 and 200 have been used for specific elements.

The support 102 comprises a substrate 104 comprising, similarly to that of FIGS. 1 and 2, a first, generally thin and flat, first portion 108 and a second portion 106 forming cooling fins. This embodiment is distinguished from the first in that the support 102 comprises only one power supply board 110. The latter extends along the top face of the first portion 108 of the substrate 104, over an orifice 130 that passes through first portion 108. The diode 112 positioned on the bottom face is electrically connected to the board 110 on the top face by means of soldered wires 116 of the bridge type that extend from the diode 112, through the orifice 130 up to contact lands 118 on the bottom face of the board 110 facing the orifice 130. The one or more diodes 112 on the top face are also connected via soldered metal wires 116, similarly to the first embodiment of FIGS. 1 and 2.

The diameter of the orifice 130 is dimensioned so as to allow the soldered metal wires 116 to be easily implemented. It may be greater than 5 mm, preferably 10 mm.

This second embodiment allows the required number of power supply board(s) 110 to be reduced, more specifically only one board 110 to be required for both faces of a substrate 104, which is particularly advantageous.

Figure 4:
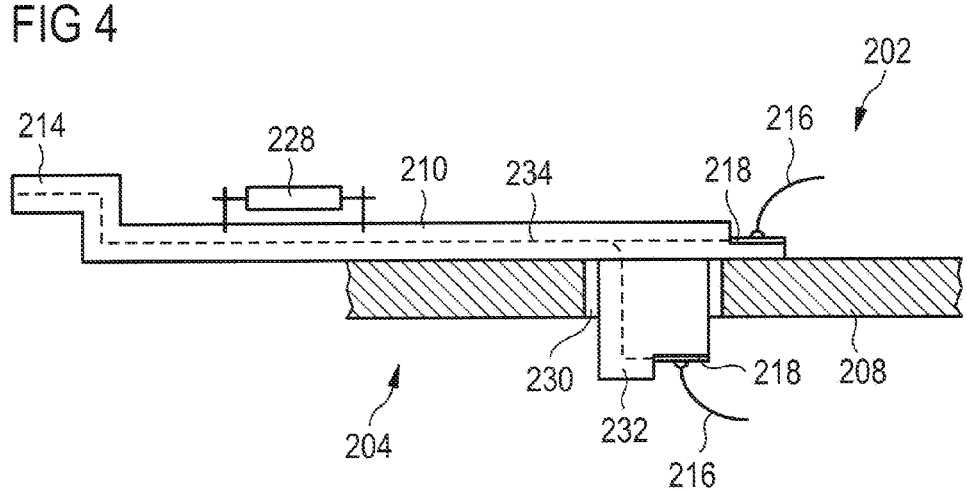
FIG. 4 is a cross-sectional view of part of a light-emitting diode support according to a third embodiment of the invention, the part that is not shown being similar to the support of FIG. 3.

FIG. 4 illustrates a third embodiment of the invention. It is a longitudinal cross-sectional view of a diode support 202, similar to FIG. 3 of the second embodiment. The cross-sectional view is partial, however, the rest of the support (not shown) being similar to that of FIG. 3. The reference numbers of the second embodiment are used in the third embodiment for elements that are similar or identical, these numbers being increased by 100 in order to clearly distinguish between the two embodiments. Reference is furthermore made for these elements to the corresponding description of the first embodiment. Specific numbers of between 200 and 300 have been used for specific elements.

The board 210, instead of being essentially planar as in the two first embodiments of the invention, is in fact a molded plastic element whose form is adapted to that of the substrate 204. The electrical circuit 234 may furthermore be embedded within the board 210 or otherwise be printed or deposited on its outer surface. A connector 214 may be directly molded along with the rest of the board 210, in the bulk of its material. Provision may be made for components 228, in particular on the outside of the board 210 in order to allow their replacement or their selection depending on a variety of functional parameters. The board 210 comprises a portion 232 that protrudes from its bottom face and passes through the orifice 230. The electrical circuit 234 may then extend through the orifice 230 within the plastic material of the board 210, more specifically of the protruding portion 232, until ending at a contact land 218 with the aim of ensuring an electrical connection with the diode of the corresponding face. The plastic material used for the board 210 is preferably a thermoplastic material. It may also be reinforced with fibers.

Figure 5:
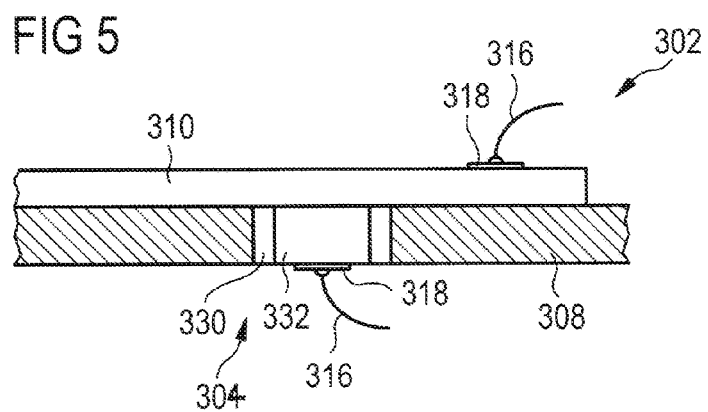
FIG. 5 is a cross-sectional view of part of a light-emitting diode support according to a fourth embodiment of the invention, the part that is not shown being similar to the support of FIG. 3.

FIG. 5 illustrates a fourth embodiment of the invention. It is a longitudinal cross-sectional view of a diode support 302, similar to FIGS. 3 and 4 of the second and third embodiments, respectively. The cross-sectional view is partial, however, the rest of the support (not shown) being similar to that of FIG. 3. The reference numbers of the third embodiment are used in the fourth embodiment for elements that are similar or identical, these numbers being increased by 100 in order to clearly distinguish between the two embodiments.

The board 310 is of similar construction to the board 110 of the second embodiment in FIG. 3, the difference being that it comprises an additional element 332 on its inner face that passes through the orifice 330 of the thin and generally flat first portion 308 of the substrate 304. This additional element 332 may be bonded to the inner face of the board 310, the latter conventionally being made of fiber-reinforced epoxy resin. The additional element 332 is preferably made of an electrically insulating material, such as e.g. a plastic material. Provision then has to be made for an electrical connection between the printed circuit on the outer face of the board 310 and the contact land 318 on the outer face of the added element 332. The additional element 332 may also be made of an electrically conductive material, for example a metal material. In this case, the size of the additional element 332 must be smaller than that of the orifice 330 in order to avoid any electrical contact. An insulator may be provided on its outer face facing the inner surface of the orifice 330. The electrical connection between the one or more diodes and the additional element 332 is similar to that of the preceding embodiments. The same applies for the electrical connection between the one or more diodes of the face opposite and the board 310.

In a general manner, it is understood that the foregoing description of the various embodiments is also valid in the case of an inversion of the top face 24 and bottom face 26.

Still in a general manner, it is to be noted that the number of diodes 12, 112 shown on the top face 24 and bottom face 26 of the portion of the substrate 4, 104, 204 of the various embodiments described above is purely exemplary; this number may vary. Each of the faces 24, 26 may thus comprise one, two or more than two diodes 12, 112 according to the arrangements of these figures.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. A support for one or more light sources for a lighting and/or light-signaling module for an automotive vehicle, comprising:

a substrate made of heat-conducting material, preferably made of a metal material;
at least one light source of light-emitting diode type with one face for mounting on the said substrate in thermal contact with the latter; and
a circuit for controlling an electrical power supply of said one or more light sources, said circuit being printed on or in a board,
wherein said circuit for controlling said electrical power supply is electrically connected to said one or more light sources by means of metal wires that are soldered to a surface of said circuit,
wherein said circuit for controlling said electrical power supply is borne by said substrate and comprises an edge that is facing said one or more light sources,
wherein said substrate comprises cooling fins,
wherein the at least one light source of light-emitting diode type is mounted on a base made of a ceramic material,
wherein said substrate includes two opposite faces, each of the two opposite faces bearing at least one of the light sources, the substrate includes an orifice that connects the two opposite faces and is positioned opposite the board,
wherein an electrical connection between the one or more light sources on the face of the substrate opposite that on which the board is positioned and the circuit extends through the orifice, and
wherein the board includes a portion that extends through the orifice, the portion including at least one electrical contact, one of the metal wires extends from the at least one electrical contact to said one or more light sources on said face of said substrate opposite that on which said board is positioned.

2. The support as claimed in claim 1, wherein said metal wires aerially extend, preferably with looping profiles, away from respective outer surfaces of said circuit for controlling said electrical power supply and said one or more light sources.

3. The support as claimed in claim 1, wherein said board is made of an electrically insulating material, wherein said board is positioned on said substrate.

4. The support as claimed in claim 3, wherein said board is generally planar, preferably made of a thermosetting resin reinforced with solid fibers.

5. The support as claimed in claim 3, wherein said board made of a molded plastic material hugging the form of said substrate.

6. The support as claimed in claim 1, wherein at least one of said metal wires, connected to said face of said board that is in contact with said substrate and to the, or one of the, diode(s) on said face of said substrate opposite that on which said board is positioned, passes through said orifice.

7. The support as claimed in claim 1, wherein said substrate comprises a first portion that forms a wall bearing said one or more light sources and a second portion comprising said cooling fins.

8. The support as claimed in claim 7, wherein said second portion is positioned essentially in line with said first portion.

9. The support as claimed in claim 7, wherein said first and second portions of said substrate are made in one piece of the same material.

10. The support as claimed in claim 1, wherein said one or more light sources are bonded or soldered to said substrate.

11. A lighting module for an automotive vehicle, comprising:
a support for said one or more light sources; and
at least one optical device that is capable of transmitting light rays that are emitted by at least one of said one or more light sources as a lighting beam,
wherein said support is in accordance with claim 1.

12. The lighting module as claimed in claim 10, comprising a first optical device that is positioned facing one of two faces of said substrate, said face bearing at least one of said, one or more, light sources and a second optical device that is positioned facing the other of said two faces, said other face bearing at least one of said one or more light sources.

13. The lighting module as claimed in claim 10, wherein said substrate comprises cooling fins that are positioned behind said one or more optical devices with respect to the main direction of an illuminating beam.

14. A method for assembling a support as claimed in claim 1, comprising the following steps:
fixing said one or more light sources, by bonding or soldering, to said substrate and placing said circuit for controlling said electrical power supply on said substrate; and
placing said metal wires between said circuit for controlling said electrical power supply and said one or more light sources by bridging and soldering using ultrasound, or laser or electric resistance soldering.

15. The support as claimed in claim 5, wherein said substrate comprises two opposite faces, each of said two opposite faces bearing at least one of said one or more light sources, said substrate comprising an orifice that connects said two opposite faces and is positioned opposite said board so as to allow an electrical connection with said one or more light sources on said face of said substrate opposite that on which said board is positioned.

16. The support as claimed in claim 3, wherein said substrate comprises cooling fins.

* * * * *